US005277755A

United States Patent [19]

O'Neill

[11] Patent Number: 5,277,755

[45] Date of Patent: Jan. 11, 1994

[54] FABRICATION OF THREE DIMENSIONAL SILICON DEVICES BY SINGLE SIDE, TWO-STEP ETCHING PROCESS

[75] Inventor: James F. O'Neill, Penfield, N.Y.

[73] Assignee: Xerox Corporation, Stamford, Conn.

[21] Appl. No.: 803,886

[22] Filed: Dec. 9, 1991

[51] Int. Cl.[5] ............ H01L 21/00

[52] U.S. Cl. ............ 156/647; 156/651; 156/654.1; 156/661.1; 156/662

[58] Field of Search ............ 156/647, 662, 651, 657, 156/661.1, 659.1

[56] References Cited

U.S. PATENT DOCUMENTS

| | | | |
|---|---|---|---|
| Re. 32,572 | 1/1988 | Hawkins et al. | 156/626 |
| 4,453,305 | 6/1984 | Janes et al. | 156/651 X |
| 4,601,777 | 7/1986 | Hawkins et al. | 156/647 X |
| 4,863,560 | 9/1989 | Hawkins | 156/644 |
| 4,875,968 | 10/1989 | O'Neill et al. | 156/633 |

*Primary Examiner*—Thi Dang
*Attorney, Agent, or Firm*—Robert A. Chittum

[57] ABSTRACT

Three dimensional silicon structures are fabricated from (100) silicon wafers by a single side, two-step anisotropic etching process using different etchants. The two etch masks are formed one on top of the other on a single side of the wafer prior to the initiation of the two-step etching process, with the mask for the largest and deepest etched recesses formed last and used first. The last formed mask is removed to expose the first formed mask. The anisotropic etchant for the smaller, closer toleranced recesses is chosen to minimize mask etching and improve dimensional control of etched recesses requiring close tolerances and uniform sizes.

6 Claims, 2 Drawing Sheets

FABRICATION OF THREE DIMENSIONAL SILICON DEVICES BY SINGLE SIDE, TWO-STEP ETCHING PROCESS

BACKGROUND OF THE INVENTION

This invention relates to a single side, two-step anisotropic etching process for the fabrication of three dimensional devices from silicon, and more particularly, to the use of the this process for fabricating silicon devices having both large recesses and high-tolerance, small recesses, such as for example, the ink flow directing part of a thermal ink jet printhead. A fundamental physical advantage of anisotropic etching in silicon is that the (111) crystal planes etch very slowly while all other crystal planes etch rapidly. Consequently, only rectangles and squares can be generated in (100) silicon material with a high degree of precision. Even with etch masks having only rectangles and squares, the dimensional precision of the etched recesses require that the edges of the mask vias defining the rectangles and squares be aligned with the intersection of the (111) and (100) crystal planes. In the semi-conductor industry, it is common to have silicon devices containing large recesses or through holes in a silicon wafer and relatively shallow high tolerance recess associated with them. For example, an ink jet printhead may be made of a silicon channel plate and a heater plate. Each channel plate has a relatively large ink reservoir etched through the silicon plate so that the open bottom defines an ink inlet and has a set of parallel shallow elongated channel recesses communicating with the reservoir at one end and opened at the other end to form nozzles. The channel recesses require precision geometries with very high tolerances. When the channel plate is aligned and bonded to the heater plate, the large recess becomes the ink reservoir and the shallow elongated channels become the capillary ink conduits between the nozzles and the reservoir, as described more thoroughly in U.S. Pat. No. RE 32,572.

In such printheads, it is frequently desirable to generate a large reservoir which is often etched completely through a 15 to 25 mil thick wafer with small perpendicularly adjacent channels which may be only 1 or 2 mils deep on the same silicon substrate surface. A major difficulty associated with fabrication of such a structure is that the channels and reservoir must be separately etched and then subsequently joined by a variety of methods, such as, for example, the use of a thick film layer on the heater plate that is patterned and etched to form ink flow bypasses. Generally, channel plates are formed by etching a plurality of reservoirs in a (100) silicon wafer first and then accurately aligning the channels to the edge of the reservoir in a second lithographic step followed by etch mask delineation and a second, short anisotropic etch step sufficient to etch the depth of the plurality of sets of associated channels. An advantage of such a process is that control of channel dimension would be very high because the mask defining the channels will be undercut about 1/10th as much as would be the case when the channel and reservoir are delineated simultaneously. This is because the (111) planes have a definite etch rate and the etch time for channels for the two cases is about a factor of 10 different. The problem with such a two-step process is that it is difficult to do a second lithography step on an anisotropically etched wafer due to the large steps and/or etched through holes.

U.S. Pat. No. 4,863,560 to Hawkins, discloses another two-step process for forming three dimensional structures from a silicon substrate by anisotropic etching. In this process, the reservoir and any necessary through holes are formed through a coarse silicon nitride mask as the wafer undergoes a relatively long etching process. Then the nitride mask is stripped to expose a previously patterned high temperature silicon oxide masking layer that is used in a subsequent shorter duration channel etching step. This process avoids the channel width variation problems associated with the previously described single-step process, as the channels are formed during a very short etch duration step. Two problems arise with this process. First, the oxide layer is subject to considerable erosion in some anisotropic etchants, for example, potassium hydroxide. Second, the oxide masking layer is a high temperature thermal oxide process usually carried out at a temperature of about 1,100° C. which can generate high concentration of oxygen precipitant defects in the wafer and disruption of the crystal lattice. Such defects can cause loss of dimensional control, especially of the channels, and result in out of tolerance silicon devices.

Application Ser. No. 07/534,467, entitled "Low Temperature Single Side Multiple Step Etching Process for Fabrication of Small and Large Structure", filed Jun. 7, 1990 to O'Neill, discloses a fabrication process for silicon wafer derived elements, such as channel plates or thermal ink jet printers that include the formation of a final etch pattern in first and second masking layers. The second masking layer is a protective layer to prevent removal of the first layer upon removal of a subsequent third masking layer. Preferably, the second masking layer is an oxide applied under low temperature conditions to lessen the possibility of inducing formation of oxygen precipitates in the wafer. A third masking layer is formed over the final etchant pattern formed by the first and second masking layers. The third masking layer is patterned to form a precursor structure of a large structure contained in the final etchant pattern. After formation of the precursor structure, the third masking layer is removed and the wafer is subjected to a final etching to form the final etched three dimensional structure. The process is useful for forming three dimensional silicon structures, such as channel plates for thermal ink jet printheads.

U.S. Pat. No. 4,875,968 to O'Neill et al., discloses a method of fabricating a thermal ink jet printhead of the type produced by the mating of an anisotropically etched silicon substrate containing ink flow directing recesses with a substrate having heating elements and addressing electrodes thereon. An etch resistant material on the surface of a (100) silicon substrate is patterned to form at least two sets of vias therein having predetermined sizes, shapes and spacing therebetween. The predetermined spacing permits selected complete undercutting by anisotropic etchant within a predetermined etching time period. The patterned silicon substrate is anisotropically etched for the predetermined time period to form at least two sets of separate recesses, each recess being separated from each other by a wall, the surfaces of the walls being (111) crystal planes of the silicon substrate, whereby certain predetermined separately etched recesses are selectively placed into communication with each other by the selective undercutting while the remainder of the undercut walls provides strengthening reinforcement to the printhead, so that larger printheads may be fabricated which are more robust without relinquishing resolution or reducing tolerances. Thus, this patent teaches that certain anisotropic etchants, such as potassium hydroxide, undercuts and etches the etch resistant mask by about 7 micrometers for a full through etch time for a 20 mil thick wafer.

At present, thermal ink jet channel plates are fabricated by two separate potassium hydroxide orientation dependent etching processes or are fabricated by a two-step potassium hydroxide orientation dependent etching process, as disclosed in U.S. Pat. No. 4,863,560. In the latter process, the channel plate reservoir is first etched followed by the etching of the channels. During the second etching step, the masking layer is a thermally grown oxide layer having the disadvantage of being readily etched in the potassium hydroxide etch bath. Thus, the high tolerance, small channel recess must be designed to accommodate not only the undercut of the oxide mask, but the etch removal of the edges of the vias in the mask as well.

SUMMARY OF THE INVENTION

It is the object of this invention to enable a single side of a silicon wafer to have at least two successive anisotropic etching proceses carried out without the need for additional intermediate lithographic steps and etch mask delineations for each subsequent etching process, and to provide a method for fabrication of three dimensional silicon device by orientation dependent etching without the drawbacks of using an oxide masking layer in potassium hydroxide. In an embodiment of the present invention, three dimensional silicon structures are fabricated from (100) silicon wafers by single side, two-step anisotropic etching process using different etchants. The two etch masks are formed one on top of the other on a single side of the wafer prior to the initiation of the two-step etching process with the mask for the largest and deepest etched recesses formed last and used first. The last formed mask is removed to expose the first formed mask without damage to the first formed mask. The anisotropic etchant for the smaller, closer toleranced recesses is chosen to minimize mask etching and to improve dimensional control of the etched recesses that must have close tolerances and uniform sizes. In the preferred embodiment, the first etch resistant mask is a thermally grown oxide and the second etch resistant mask is silicon nitride. The silicon nitride mask is patterned to form vias which are within the vias of the first mask. Thus, the silicon nitride mask always protects the oxide mask and therefore, the anisotropic etchant may be potassium hydroxide. The silicon nitride mask is then removed, exposing the patterned oxide mask. The etchant used with the dioxide mask is ethylene diamine-pyrocatechol-water (EDP) even though the etch rate ratio between the (100) and (111) planes is reduced to about one-half the rate of that of KOH. However, the EDP etchant has the advantage that the etch rate of the dioxide layer in EDP is nearly negligible at about three angstrom per minute.

The foregoing features and other objects will become apparent from a reading of the following specification in conjunction with the drawings, wherein like parts have the same index numerals.

DESCRIPTION OF THE PREFERRED EMBODIMENT

Figure 1:
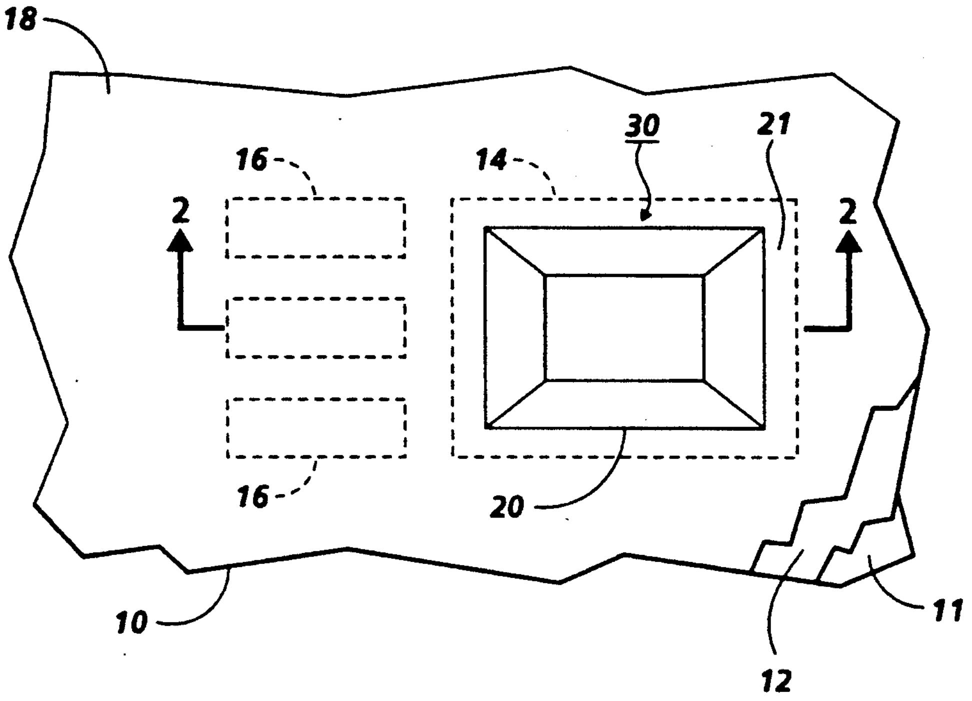
FIG. 1 is an enlarged partially shown schematic plan view of the channel plate which has undergone a first etching step in accordance with the present invention.

In FIG. 1, a (100) silicon wafer 10 is partially shown in plan view with a thermally grown oxide layer ($SiO_2$) 12 on both sides 11 and 13 (FIG. 2) to a thickness of 1,000 to 7,500 Å. It is lithographically processed to form a via 14 and a set of elongated parallel vias 16 in one surface 11, the surface viewed in FIG. 1. These vias enable the production of high tolerant small recesses and the large recess which will subsequently serve as ink channels and a reservoir and a channel plate for a thermal ink jet printhead. The channel plate has been chosen as a typical three dimensional silicon device for illustration of the present invention. Although FIG. 1 shows only three elongated vias 16 as representing the eventual ink channels, there are 150 to 1,000 per inch in an actual printhead. This simplified schematic plan view with a small number of vias 16 is shown for ease of explanation, it being understood that the same principle applies for an actual printhead. After the oxide layer 12 is patterned to form the vias 14 and 16, a silicon nitride ($Si_3N_4$) layer 18 is deposited on both sides of the wafer and the silicon wafer surface 11 which is exposed through the vias patterned in the oxide layer.

The thickness of the silicon nitride layer is sufficient to assure sufficient step coverage and adequate robustness to prevent handling damage during subsequent processing steps, as well as provide an adequate etch resistant mask. Generally, the silicon nitride is deposited to a thickness of between 1,000 Å and 3,000 Å. The silicon nitride layer is then lithographically processed to produce via 20, so that via 20 exposes the bare silicon surface 11 of wafer 10. A border 21 of silicon nitride is provided which is about 25 micrometers wide inside of the oxide via 14 for the protection of the oxide layer. A border of this dimension would protect the oxide layer even with a seven micrometer undercut, which normally occurs with a subsequent anisotropic etching process. This is necessary since the usual anisotropic etchant is potassium hydroxide (KOH) and KOH etches the oxide layer. Thus, exposed oxide via edges would be etched and tend to increase the size thereof, thereby making the fabrication process more complex to design, especially if both high tolerant, small recesses and large recesses are provided in a three dimensional silicon device fabricated by an orientation dependent etching process.

After the via 20 is patterned into the silicon nitride layer 18, the wafer 10 is anisotropically etched in KOH for a predetermined time period of about three hours to etch the recess 22 completely through the wafer to form, in this example of three dimensional silicon device, a reservoir 30 with open bottom for use as an ink inlet.

Figure 2:
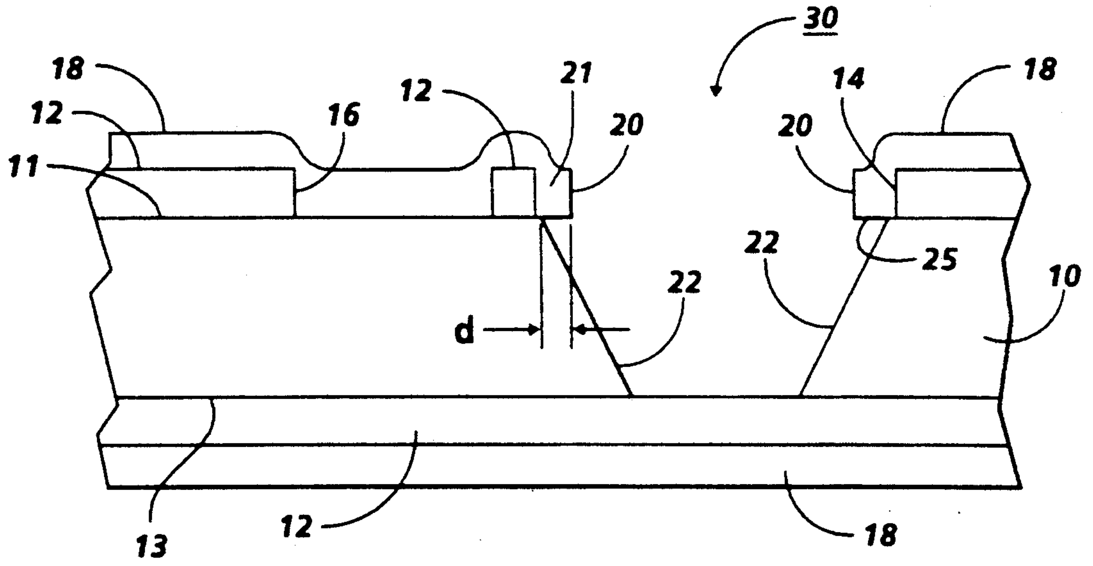
FIG. 2 is a cross-sectional view of FIG. 1 as viewed along view line 2—2.

FIG. 2 is a cross-sectional view of FIG. 1 as viewed along view line 2—2 thereof, and after a first anisotropic etching, so that the reservoir recess 30 is shown together with vias 14, 16 that are covered by the silicon nitride layer 18. The undercut 25 is shown having an undercut distance D, typically 7 micrometers.

Figure 3:
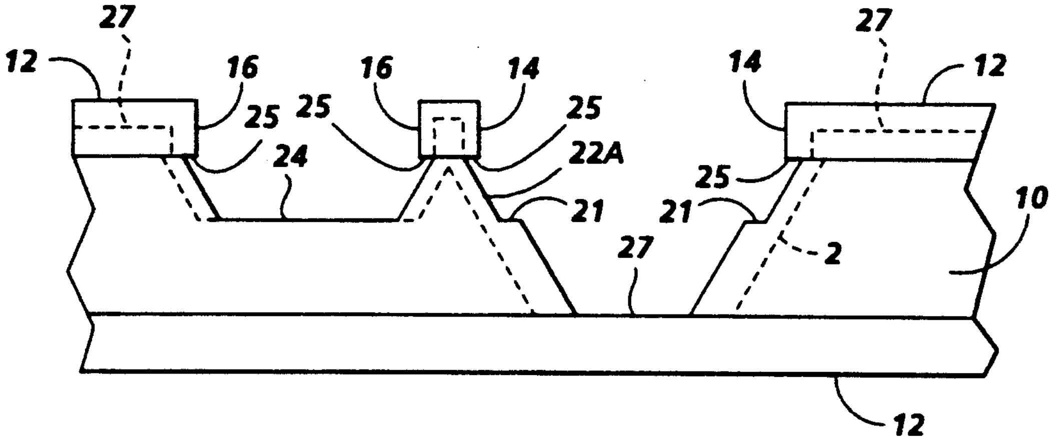
FIG. 3 is a partially shown cross-sectional view of the channel plate shown in FIG. 2 after the channel plate has undergone a second etching step.

In FIG. 3, a cross-sectional view of the wafer of FIG. 2 is shown after the silicon nitride layer 18 has been removed, the wafer cleaned, and the wafer orientation dependently etched again using the patterned oxide layer 12 as an etch resistant mask to etch the small, closely toleranced channel recesses 24. If an anisotropic etchant, such as KOH, was used for this process step, the oxide masking layer would also be etched as shown in dashed line 27. Such erosion of the masking layer would make designing three dimensional silicon devices having very closely toleranced, small etched recesses a very complex endeavor. However, by changing from a KOH etch to an ethylenediamine-pyrocatechol-$H_2O$ etch (EDP), the fabrication is greatly improved. EDP etch rate of the oxide layer is around three angstrom per minute, which is negligible and can be discounted for etching of small recesses since the etching time for EDP is only about 40 to 50 minutes. Although the EDP etch rate ratio between the (100) and (111) crystal planes is reduced by about one-half that for KOH, the small channel recesses 24 are still etched in well under an hour; depending upon etchant composition, etchant temperature, and feature dimensions. Although this is about twice as long as that necessary for KOH, the increased time period is insignificant in view of the advantages the elimination of the need to account for mask erosion and consequent increase in via size, as well as, the normal undercut of the oxide layer in the etchant bath. This second etching step is the most critical, since this etching defines the final channel width for each of the channels in the channel plate and the uniformity of the channel widths in turn define the uniformity of the ink droplet size and thus, the overall quality and resolution of the printhead.

After termination of the final etching step, the etch resistant oxide layer 12 is removed. The wafer portion 10 now has a fully formed large reservoir 30 having a through opening 27 and channels 24. A land 29 has been formed in the wafer surface 11 between the reservoir 30 and the channels 24 which will be bypassed by a trench formed in a thick film layer on the heater plate, as is well known in the art. For example, refer to U.S. Pat. No. 4,774,530 to Hawkins. Forming land 29 is desirable between the channels in the reservoir because orientation dependent etching processes produce poor formation of outside angles as mentioned earlier. If desired, however, the land could be removed by a dicing operation which would provide communication between the channels and the reservoir without the need of a bypassing flow path for the ink. Although the foregoing description is in the context of a single channel die, it should be realized that many channel dies are formed simultaneously in this process from a single silicon wafer as taught by U.S. Pat. No. RE 32,572 to Hawkins et al. Referring to FIG. 3, the silicon nitride layer 18 shown in FIG. 2 has been stripped, the wafer cleaned, and the wafer again anisotropically etched in an anisotropic etchant EDP using the silicon oxide layer 12 as a mask to etch the channels 24. Concurrently with the channel etching, the border 21 is etched slightly enlarging the reservoir, while maintaining its (111) crystal plane wall. As is typical with all anisotropic etchants, the mask is undercut slightly as shown at 25.

Figure 4:
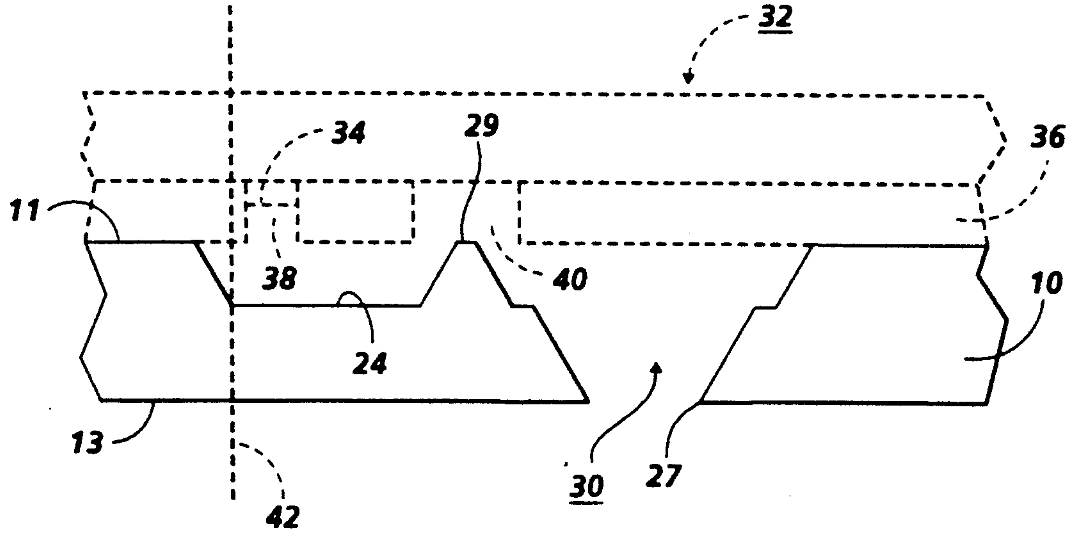
FIG. 4 is similar to FIG. 3 showing the masking layers removed and with the heater plate added in dashed line.

FIG. 4 shows in cross section, a completed three dimensional silicon device which, in this case, is a channel plate. The oxide masking layer 12 has been removed. Heater plate 32 has been added in dashed line for better understanding of the function of a channel plate in a thermal ink jet printhead. As is disclosed in U.S. Pat. No. 4,774,530, the heater plate has an array of heating elements 34 and a thick film layer 36 patterned to expose the heating elements by a pit 38 and to provide a flow path around channel plate land 29 by trench 40. The channel plate wafer and heater plate wafer are aligned, bonded and diced to separate the bonded die into a plurality of individual printheads. Dashed line 42 indicates the location of the dicing cut to form nozzles at the end of channels 24. Thus, ink enters the printhead through inlet 27 to fill reservoir 30 and flows around land 29 through the thick film trench 40 which provides communication between the channels 24 and reservoir 30. The channels are filled with ink by capillary action and forms a meniscus at the nozzles formed by a dicing cut along the dicing line 42.

In summary, this invention relates to the batch fabrication of three dimensional silicon devices by a single side, two step anisotropic or orientation dependent etching process. Both etch resistant layers are sequentially formed and patterned, one on top of the other, on a single side of a silicon wafer. The highest tolerance or finest etch resistant patterned layer is patterned first and the coarsest etch resistant patterned layer is patterned last, but used first. The large coarser vias patterned in last deposited etch resistant layer are located, so that a large underlying via in the first formed and patterned etch resistant layer surrounds the large vias in the last deposited and patterned etch resistant layer with a peripheral space or border provided which will protect the first etch resistant layer from the anisotropic etchant used first; generally, the first of such etchants is KOH and the last etch resistant material is silicon nitride. Once the coarse anisotropic etching is completed, the last deposited etch resistant layer is removed. The first formed etch resistant layer must be of a material which will not be damaged by the removal of the overlying last deposited etch resistant layer, and, of course, must be of a different material so that it is not removed with the last layer. Next, the high tolerance, small recesses are etched in an anisotropic etchant which will not etch its patterned etch resistant layer, as is generally the case in prior art fabricating techniques. Because the first formed etch resistant material are formed at high temperatures, such as, for example, thermally grown silicon dioxide, oxygen precipitates are generated which cause defects in the etched recesses, thereby impacting the dimensional tolerances of the recesses. By being able to use a thinner etch resistant layer because it is not etched by the anisotropic etchant, the time to grow the oxide layer is less and the time to produce the oxygen precipitates is correspondingly less. Use of EDP as the second anisotropic etchant, which essentially does not etch silicon dioxide, thereby provides the benefit of more control of the high tolerance recesses and reduces the amount of oxygen precipitates generated due to reduced time to grow a thinner oxide layer. The oxygen precipitates are undesirable because they create defects in the etched recesses.

Although the foregoing description illustrates the preferred embodiment as a thermal ink jet channel plate, other variations and other three dimensional silicon structures are possible. All such variations and other structures as will be obvious to one skilled in the art are intended to be included within the scope of this invention as defined by the following claims.

I claim:

1. A method of fabricating a three dimensional device from a two sided (100) silicon wafer having both large recesses and high tolerance, small recesses formed in only one side thereof by anisotropic etching, comprising the steps of:

(a) depositing a first layer of a first etch resistant material on both sides of the wafer to a predetermined thickness sufficient to protect the wafer covered by said first layer during subsequent anisotropic etching thereof, the deposited thickness of said first layer being controlled by length of time of deposition;

(b) patterning the first layer of etch resistant material on one side of the wafer to produce vias for subsequent anisotropic etching of high tolerance recesses;

(c) depositing a second layer of a second etch resistant material over the first layer of the first etch resistant material on both sides of the wafer, including the vias in said one side of the first layer;

(d) patterning the second layer of etch resistant material on the same side of the wafer containing the vias in said first layer of first etch resistant material to produce at least one via in the second layer of second etch resistant material that is within the boundary of any one of the vias in said first layer of first etch resistant material for producing relatively large recesses in the wafer by anisotropic etching, the vias patterned in the second layer of second etch resistant material always being within the boundaries of the vias in the first etch resistant mask, so that the first layer of etch resistant material is not exposed;

(e) placing the wafer into a first anisotropic etchant for a predetermined time period to etch the relatively large recesses in the wafer through the vias in the second layer of the second etch resistant material;

(f) removing the second layer of second etch resistant material without damaging the first layer of first etch resistant material; and (g) placing the wafer with the patterned first etch resistant material into a second anisotropic etchant for a predetermined time period to etch the high tolerance small recesses, the second anisotropic etchant being different from the first anisotropic etchant, the first etch resistant material being substantially non-etchable in the second anisotropic etchant, thereby permitting said predetermined thickness of the first layer of first etch resistant material to be relatively thin, with the results that defect producing precipitates which are generated in the wafer in proportion to the thickness of said first layer are reduced and dimensional control of the high tolerance, small recesses is improved.

2. The method of claim 1, wherein the first layer of etch resistant material is a thermally grown silicon dioxide and the second layer of etch resistant material is silicon nitride.

3. The method of claim 2, where in silicon dioxide layer has a thickness of about 1,000 to 2,500 Å and the silicon nitride layer has a thickness of about 1,000 to 3,000 Å.

4. The method of claim 3, wherein the first anisotropic etchant is potassium hydroxide (KOH), and wherein the second anisotropic etchant is ethylenediamine-pyrocatechol-$H_2O$ (EDP).

5. A method of fabricating a three dimensional device from a two sided (100) silicon wafer having both large recesses and high tolerance, small recesses formed in only one side thereof by anisotropic etching, comprising the steps of:

(a) depositing a layer of thermally grown silicon dioxide on both sides of the wafer, the silicon dioxide layer having a thickness of about 1,000 to 2,500 Å;

(b) patterning the silicon dioxide layer on one side of the wafer to produce vias for subsequent anisotropic etching of high tolerance recesses;

(c) depositing a layer of silicon nitride over the silicon dioxide layer on both sides of the wafer, including the vias in said one side of the silicon dioxide layer, the silicon nitride layer having a thickness of about 1,000 to 3,000 Å;

(d) patterning the silicon nitride layer on the same side of the wafer containing the vias in the silicon dioxide layer to produce at least one via in the silicon nitride layer that is within the boundary of any one of the vias in the silicon dioxide layer for producing relatively large recesses in the wafer by anisotropic etching, the vias patterned in the silicon nitride layer always being within the boundaries of the vias in the silicon dioxide layer, so that the silicon dioxide layer is not exposed;

(e) placing the wafer into a first anisotropic etchant for a predetermined time period to etch the relatively large recesses in the wafer through the vias in the silicon nitride layer;

(f) removing the silicon nitride layer from the wafer without damaging the silicon dioxide layer; and (g) placing the wafer with the patterned silicon dioxide layer on one side and unpatterned silicon dioxide layer on the other side into a second anisotropic etchant for a predetermined time period to etch the high tolerance small recesses, the second anisotropic etchant being different from the first anisotropic etchant, the silicon dioxide being substantially non-etchable in the second anisotropic etchant, so that dimensional control of the high tolerance, small recesses is improved.

6. The method of claim 5, wherein the first anisotropic etchant is potassium hydroxide (KOH), and wherein the second anisotropic etchant is ethylenediamine-pyrocatechol-$H_2O$ (EDP).

* * * * *